United States Patent [19]
Iijima et al.

[11] Patent Number: 5,583,670
[45] Date of Patent: Dec. 10, 1996

[54] POLYMER DISPERSED LIQUID CRYSTAL INFORMATION RECORDING MEDIUM WITH INFORMATION RECORDING LAYER COMPRISING ACRYLIC OR METHACRYLIC RESIN HAVING MOLECULAR WEIGHT OF 25,000 TO 100,000 AND INFORMATION RECORDING AND REPRODUCING METHOD

[75] Inventors: Masayuki Iijima; Yuichi Nakayasu, both of Tokyo, Japan

[73] Assignee: Dia Nippon Printing Co., Ltd., Tokyo, Japan

[21] Appl. No.: 117,054

[22] PCT Filed: Jan. 8, 1993

[86] PCT No.: PCT/JP93/00010

§ 371 Date: Sep. 10, 1993

§ 102(e) Date: Sep. 10, 1993

[30] Foreign Application Priority Data

Jan. 10, 1992 [JP] Japan ..................... 4-003394

[51] Int. Cl.⁶ .................. G02F 1/1333; G02F 1/133; G02F 1/13
[52] U.S. Cl. ............... 349/86; 349/89; 349/116; 349/183
[58] Field of Search ............... 359/51, 72, 52, 359/103

[56] References Cited

U.S. PATENT DOCUMENTS

| | | | |
|---|---|---|---|
| 5,034,301 | 7/1991 | Miyagawa et al. | 430/138 |
| 5,093,735 | 3/1992 | Doane et al. | 359/52 |
| 5,105,185 | 4/1992 | Nakanowatari et al. | 359/51 |
| 5,107,352 | 4/1992 | Fergason | 359/51 |
| 5,132,815 | 7/1992 | Fergason | 359/51 |
| 5,142,389 | 8/1992 | Fergason | 359/51 |
| 5,168,380 | 12/1992 | Fergason | 359/51 |
| 5,200,107 | 4/1993 | Piermattie et al. | 359/103 |
| 5,260,815 | 11/1993 | Takizawa | 359/72 |
| 5,427,828 | 6/1995 | Park | 359/75 |
| 5,473,448 | 12/1995 | Yoshinaga et al. | 359/51 |
| 5,475,515 | 12/1995 | Yoshinaga et al. | 359/52 |
| 5,488,601 | 1/1996 | Sakano et al. | 369/120 |

FOREIGN PATENT DOCUMENTS

| | | |
|---|---|---|
| 404575 | 6/1990 | European Pat. Off. . |
| 2-245735 | 10/1990 | Japan . |
| 2-245731 | 10/1990 | Japan . |
| 3-155525 | 7/1991 | Japan . |

*Primary Examiner*—Anita Pellman Gross
*Assistant Examiner*—Toan Ton
*Attorney, Agent, or Firm*—Sughrue, Mion, Zinn, Macpeak & Seas

[57] ABSTRACT

The information recording medium of the present invention comprises an information recording layer made of acrylic resin or metacrylic resin 11 being laminated on an electrode layer 13, a liquid crystal phase 12 being dispersed and fixed on said information recording layer, whereby said acrylic resin or metacrylic resin has weight average molecular weight of 10,000 to 100,000, electrostatic information can be permanently recorded and stored as visible information, and the visible information can be reproduced at any desired time. Further, the visible information can be easily erased by heating, and medium can be re-used.

9 Claims, 2 Drawing Sheets

POLYMER DISPERSED LIQUID CRYSTAL INFORMATION RECORDING MEDIUM WITH INFORMATION RECORDING LAYER COMPRISING ACRYLIC OR METHACRYLIC RESIN HAVING MOLECULAR WEIGHT OF 25,000 TO 100,000 AND INFORMATION RECORDING AND REPRODUCING METHOD

TECHNICAL FIELD

The present invention relates to an information recording medium for recording and storing electrostatic information as visible information and a method for recording and reproducing such information.

BACKGROUND TECHNIQUE

Liquid crystal display elements are now widely used in display unit in electronic office system such as word processor, lap-top computer, etc. The element comprises a liquid crystal phase sandwiched between transparent substrates such as glass or plastic substrates with transparent electrode films. When voltage is applied between the two electrodes using single matrix or active matrix, information such as an image is displayed. As the methods to accomplish the purpose, there are a method using dynamic scattering operated by typical TN type on STN type or other current effect, a method utilizing phase transition of cholesteric-nematic, and a method combining macromolecule with liquid crystal.

In the element, which comprises nematic liquid crystals dispersed and fixed on macromolecular resin, refractive index of liquid crystal is equalized with refractive index of macromolecular resin, and voltage is applied to align orientation of liquid crystal substance in voltage-applying direction and to turn it to transparent state. When voltage is not applied, orientation of liquid crystal substance is not aligned, and light is scattered in boundary surface between liquid crystal substance and macromolecular resin or in the dispersed and fixed liquid crystal phase, thus turning it to non-transparent state. As a result, display is accomplished by utilizing transparency and non-transparency. The liquid crystal element, which comprises nematic liquid crystals dispersed and fixed on macromolecular resin, is characterized in that the area is large, response time, particularly falling time, is short, polarizing plate is not required and light utilizing efficiency is high, vision angle is wide and uniform, or it is flexible. Accordingly, it is used in light-adjusting sheet for window or in projection type display.

It is also extensively used for projection type display or computer display, and it is more advantageous than TN type or STN type display because falling time is as short as 1 to 30 ms. Such liquid crystal display element is sandwiched between electrodes, and AC voltage is applied, and display and erasing are performed by turning on and off. In this case, hysteresis occurs in voltage vs. light transmittance, and it is reported that there are some differences in transmittance between AC voltage increase and voltage drop. When AC voltage is turned off, or when no voltage is applied, it is turned to the initial transmittance, i.e. non-transparent state.

As the method to display information such as image, a method to sandwich the element between matrix electrodes and to perform display by turning voltage on and off for each pixel is generally used, while image-like pattern electrodes are also used. Also, there is a method, in which, when composite film of macromolecule and liquid crystal is formed, image-like ultraviolet ray is irradiated using UV-setting type macromolecular material. In any case, fixed information is flashed on and off. On the other hand, as the element with memory property, there is the one utilizing cholesteric-nematic phase transition. In this method, liquid crystal is sandwiched between transparent electrodes.

It is an object of the present invention to provide an information recording medium, which has an information recording layer laminated on an electrode layer and is used for recording electrostatic information in visible state, and which can provide permanent recording in visible state, and also to provide a method for recording and reproducing such information.

DISCLOSURE OF THE INVENTION

The information recording medium of the present invention comprises an information recording layer made of acrylic resin or methacrylic resin laminated on an electrode layer, a liquid crystal phase is dispersed and fixed on said information recording layer, and weight average molecular weight of said resin is 10,000 to 100,000.

The information recording medium of the present invention comprises an information recording layer made of acrylic resin or methacrylic resin being laminated on an electrode layer, a liquid crystal phase is dispersed and fixed on said information recording layer, and weight average molecular weight of said resin is 10,000 to 100,000 and acid number is two or more.

The invention is also characterized in that said liquid crystal phase is nematic phase or cholesteric phase at operating environmental temperature.

It is also characterized in that said information recording layer is processed by heat treatment, heating at higher than room temperature and lower than isotropic phase transition temperature of the liquid crystal.

It is also characterized in that said resin has glass transition temperature higher than operating environmental temperature.

It is also characterized in that said information recording layer is laminated on the electrode layer through a charge blocking layer.

The information recording and reproducing method of the present invention comprises an information recording medium and a photosensitive member, said information recording medium has an information recording layer made of acrylic resin or methacrylic resin being laminated on an electrode layer, a liquid crystal phase is dispersed and fixed on said information recording layer, said resin having weight average molecular weight of 10,000 to 100,000, said photosensitive layer having a photosensitive layer on an electrode layer, whereby said information recording medium is placed face-to-face to said photosensitive member, electrostatic information is recorded by exposing to light from direction of the photosensitive member or the information recording medium while applying voltage across the two electrodes, the electrostatic information is recorded and stored as visible information and is reproduced at any time desired.

Further, the information recording and reproducing method of the present invention is characterized in that there are provided an information recording medium and a photosensitive member having a photoconductive layer on an electrode layer, said information recording mediumscomprises an information recording layer made of acrylic resin or methacrylic resin being laminated on an electrode layer, a liquid crystal phase being dispersed and fixed on said information recording layer, said resin having weight average molecular weight of 10,000 to 100,000 and acid number of 2 or more, said information recording medium is placed face-to-face to said photosensitive member, electrostatic information is recorded by exposing to light from direction of the photosensitive member or the information recording medium while applying voltage across the two electrodes, and the electrostatic information is recorded and stored as visible information and is reproduced at any time desired.

It is also characterized in that said visible information is reproduced by transmitted light or by reflected light.

The information recording medium of the present invention comprises an information recording layer being placed on an electrode layer, a liquid crystal phase is dispersed and fixed in acrylic resin or methacrylic resin, and orientation of the liquid crystal phase corresponding to information electric charge is permanently retained, and the recorded information has memory property. Because of the memory property, by providing a charge retaining layer on the information recording layer or by providing a charge blocking layer between the electrode layer and the information recording layer, it is possible to increase orientation property of the liquid crystal phase in the information recording layer, i.e. to increase preservation property of visible information and also to increase permanent maintenance of information recording. Further, by providing the charge retaining layer, it is possible to electrically reproduce electrostatic information recorded in, the charge retaining layer and to electrically reproduce the information.

In the information recording medium of the present invention, liquid crystals are dispersed in macromolecules and are used as an information recording layer. In so doing, it is possible to easily obtain electro-optical effect and to record and memorize analog information. The liquid crystal phase in the information recording layer is not transparent due to light scattering when there is no electric field by the information electric charge. When information electric charge is applied, liquid crystal phase is oriented by action of electric field. By approximately equalizing light refractive index of the liquid crystal phase and light refractive index of the resin, the information recording portion can be kept in transparent state, and the recorded information can be reproduced by contrast between scattered light and transmitted light without using a polarizing plate. Thus, it is possible to simplify optical system used for reading the information.

Further, in the information recording medium of the present invention, the information recording layer can be produced in uniform thin film by coating technique, and it is possible to uniformly reduce the gap between the information electric charge and the conductive layer on the surface of the information recording layer. Thus, it is possible to produce an information recording medium with larger area and to record and reproduce images with high resolution.

BEST MODE FOR CARRYING OUT THE INVENTION

Figure 1A:
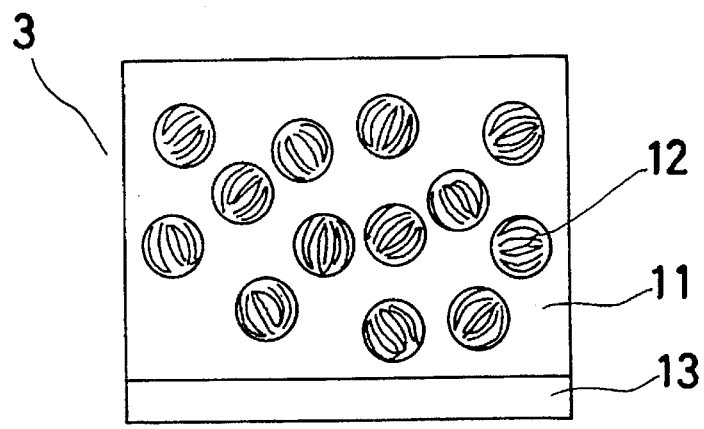
FIG. 1 is a schematical cross-sectional view of an information recording medium of the present invention, where (a) represents a schematical view before information is recorded, (b) is a drawing for explaining information recording and reproducing condition of the information recording medium after information has been recorded, and (c) shows another example of the information recording medium of the present invention.
Figure 1B:
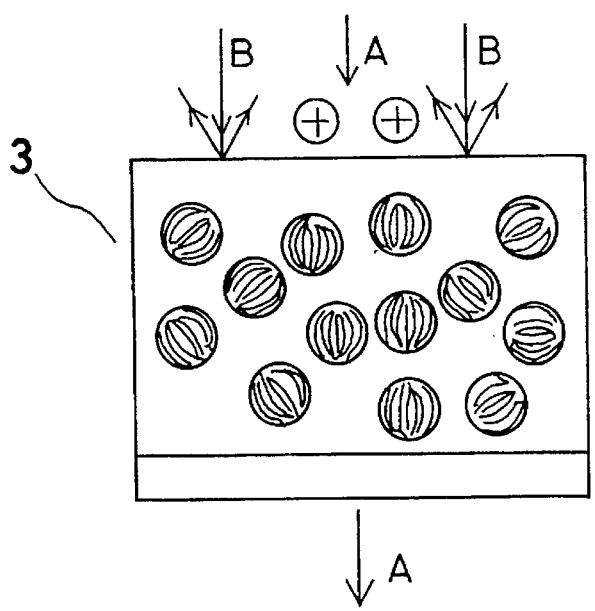
Figure 1C:
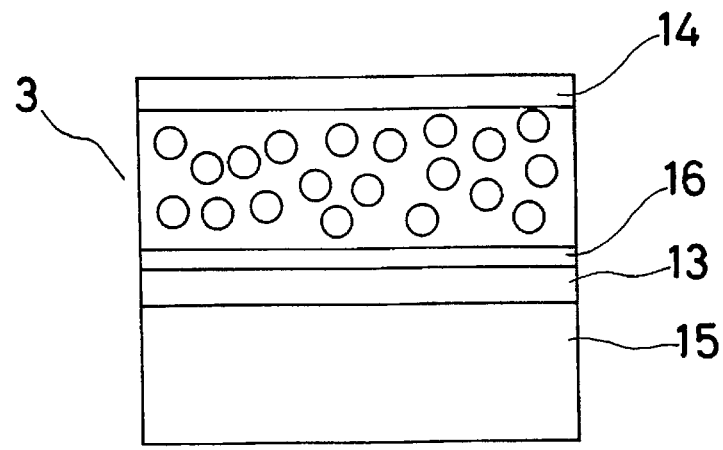
Figure 2A:
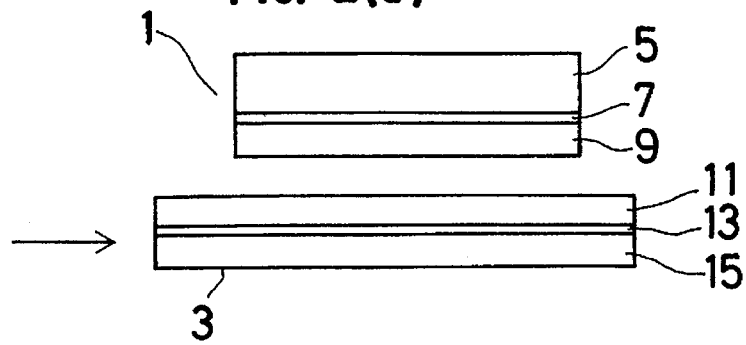
FIG. 2 shows an information recording method using a photosensitive member.
Figure 2B:
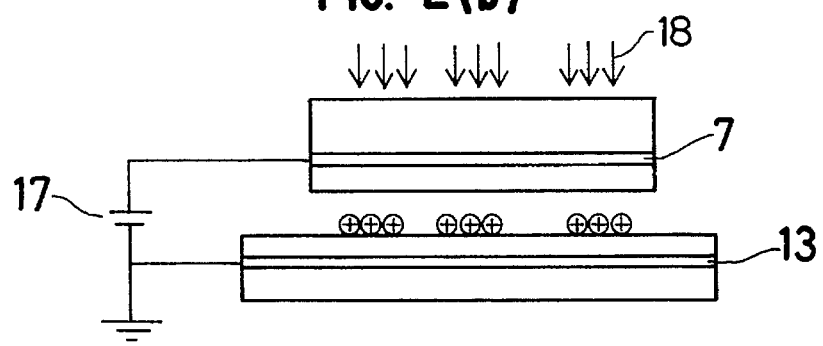
Figure 2C:
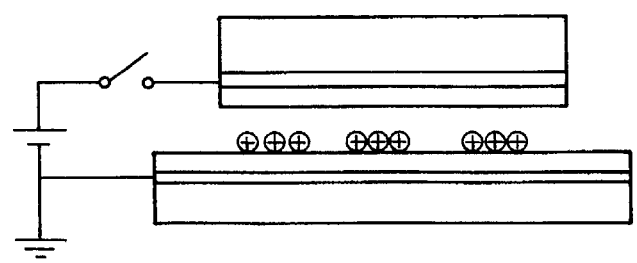
Figure 2D:
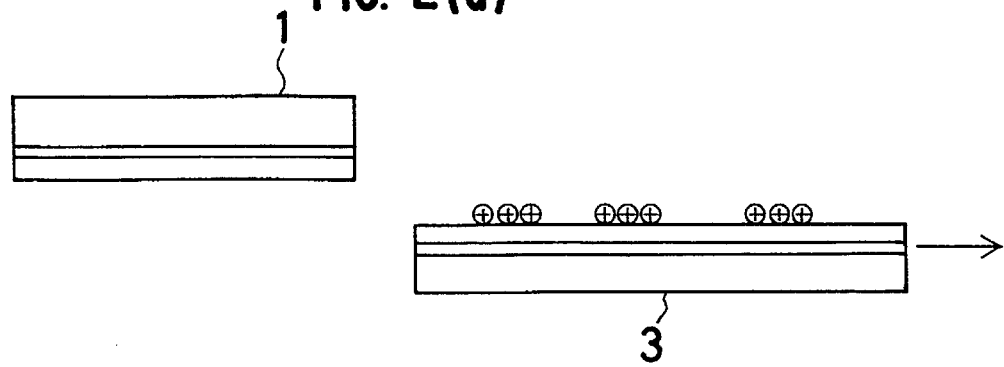

FIG. 1 is a drawing for explaining a cross-section of the information recording medium of the present invention, where (a) represents a schematical view before information is recorded, (b) shows information recording and reproducing condition of the information recording medium after information has been recorded, and (c) represents another example of the information recording medium of the invention.

In the figures, the reference numeral 3 represents an information recording medium, 11 a resin, 12 a liquid crystal phase, 13 an electrode layer, 14 a charge retaining layer, 15 a support member, and 16 a charge blocking layer, First, as shown in FIG. 1(a), the information recording medium of the present invention has such structure that an information recording layer made of a liquid crystal phase 12 and a resin 11 is laminated on an electrode 13. The information recording layer contains low molecular weight liquid crystal material 12 dispersed and fixed in the resin 11. As the liquid crystal material, nematic liquid crystal or cholesteric liquid crystal showing nematic phase or cholesteric phase at operating environmental temperature or a mixture of these may be used. For example, as the nematic material, the following substances may be used.

Schiff's base type substance, such as

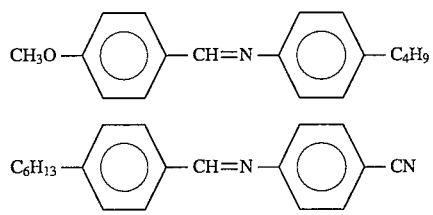

Azoxy type substance, such as

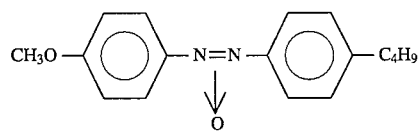

Azo type substance, such as

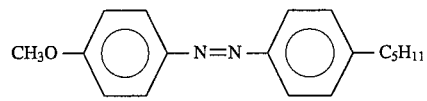

Phenyl benzoate ester type, such as

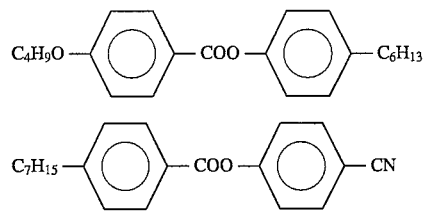

Phenyl cyclohexylate ester type, such as

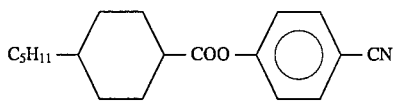

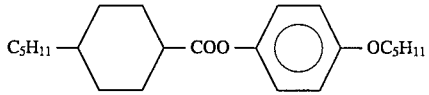

Biphenyl type, such as

Terphenyl type, such as

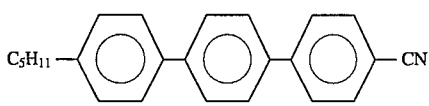

Phenyl cyclohexane type, such as

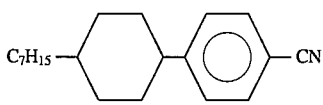

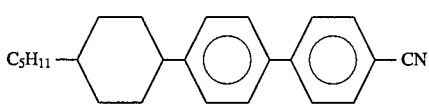

Phenyl pyridine type, such as

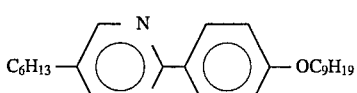

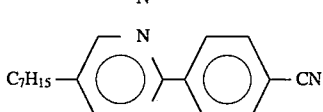

Phenyl dioxane type, such as

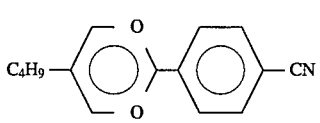

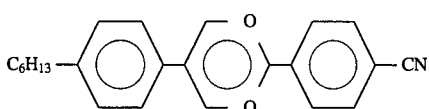

Polycyclic ethane type, such as

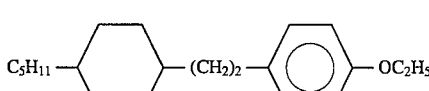

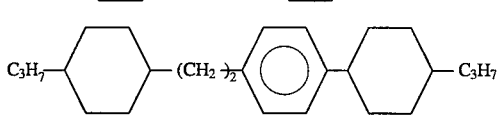

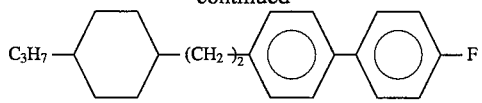

Phenyl cyclohexane type, such as

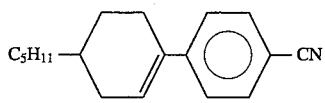

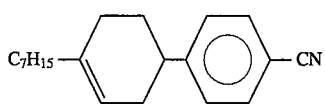

Cyclohexyl pyrimidine type, such as

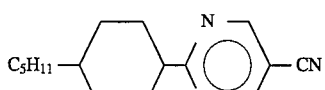

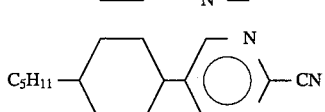

Phenyl type, such as

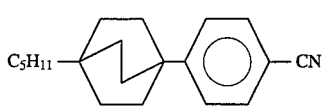

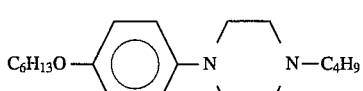

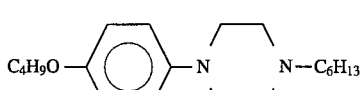

Others, such as

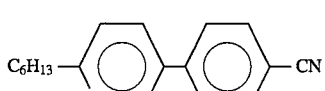

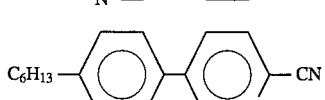

Or, tolane type, such as

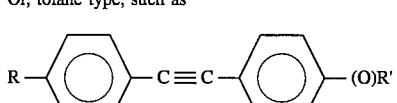

(where R and R' each represents an aliphatic or

R—Z—Z—CN

RO—Z—Z—R (where R represents an aliphatic hydrocarbon, Z represents a benzene ring, cyclohexane ring or hetero-hexa-ring) or

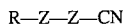

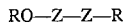

(where R represents an aliphatic hydrocarbon, Z represents a benzene ring, cyclohexane ring or hetero-hexa-ring)

When selecting liquid crystal material, it is preferable to select a material with higher anisotropy of refractive index because it is easier to have contrast.

The resin 11 is an acrylic resin or a methacrylic resin and is a solvent-soluble resin having compatibility in a solvent common to liquid crystal material, for example, methyl acrylate resin, methyl metacrylate resin or homopolymer such as ethyl ester, isobutyl ester, t-butyl ester of the above resins may be used, or copolymer containing acrylnitrile resin and the above resins as main components may be used. It is preferable that weight average molecular weight of acrylic resin or matacrylic resin is 10,000 to 100,000. If weight average molecular weight of the resin is more than 100,000, solubility in solvents is decreased, and coating property is reduced. Further, this causes loss of memory property.

As such acrylic resin, for example the following products produced by Mitsubishi Rayon Co., Ltd. may be used: BR-80, BR-83, BR-87, BR-52, BR-107, BR-106, BR-88, BR-85, BR-100, BR-101, LR-1065, LR-186, LR-143, LR-158, LR-177, LR-162, LR-167, LR-472, LR-637, LR-574, LR-016, LR-155, LR-237, LR-254, LR-257, LR-286, LR-1503, LR-1573 and LR-1589.

It is preferable that the acid number of the acrylic resin is 2 or more. If the acid number is less than 2, memory property decreases. Also, it is preferable to use the resin, which has glass transition temperature higher than the operating environmental temperature of the information recording medium. If it is lower than the operating environmental temperature, the information recording medium is turned to opacity even when the information has been recorded, and memory property is lost.

In the information recording layer of the present invention, it is essential that refractive index of the resin is approximately equalized with refractive index of oriented liquid crystal. If there is big difference between refractive indices of the two, reflection and scattering occur on boundary surface between the liquid crystal and the resin, and transparent condition is not attained during recording.

The ratio of the liquid crystal to total quantity of the resin and the liquid crystal material is preferably 30 to 60 weight %. If the quantity of the liquid crystal material used is lower, transparency during non-recording is high, and when information is recorded and liquid crystal phase is oriented, contrast is low. If the quantity used is in excess, it is not desirable because liquid crystal seeps and memory property is lost.

To form the information recording layer, the resin and the liquid crystal material are dissolved in solvent, and the solution is coated on an electrode layer by commonly used coater such as blade coater, roll coater, or spin coater. As the solvents, chloroform, dichloromethane, benzene, toluene, xylene, tetrahydrofurane, dioxane, etc. may be used. It is preferable to prepare a coating solution containing solid concentration of 30 to 60 weight %. The thickness of the information recording layer is preferably 1 to 40 μm after drying, or more preferably, 4 to 20 μm.

When the coated layer is heated and the solvent is dried, the resin is solidified and the phase separation occurs in the liquid crystal material, and it appears that it is dispersed and fixed in the resin as a liquid crystal phase with particle size of less than μm level. When the coating solution is dried, it is necessary to maintain the temperature at a level lower than the temperature, at which the liquid crystal material is transferred to random state, i.e, so-called isotropic phase, and to remove the solvent. If the resin is dried and solidified in the condition where it is transferred to isotropic phase, liquid crystal property cannot be obtained, and electro-optical effect is not provided. This may be attributable to the fact that, if temperature is high when drying, sufficient condition for phase separation of liquid crystal and resin is not attained, and resin and liquid crystal are dried in compatible state.

A radiation ray setting resin not yet hardened as resin and having compatibility with liquid crystal material in the state of monomer or oligomer, e.g. acrylate ester or methacrylic ester, may be used, and after the coating solution has been dried, radiation ray may be irradiated to harden, and this may be used as the information recording layer.

There is no restriction of the material quality of the electrode layer 13, except that specific resistance is $10^6 \Omega \cdot cm$ or less, and conductive metal film, inorganic metal oxide conductive film such as indium tin oxide (ITO), or organic conductive film such as tertiary ammonium salt may be used. Such electrode is formed on a support member or on the information recording layer by methods such as deposition, sputtering, CVD, coating, plating, dipping, electrolytic polymerization, etc. It is necessary to adjust the film thickness by selecting electrical property of the material of the electrode or by changing application voltage during information recording. For example, it is about 100 to 3000 Å in case of ITO film, and it is formed over the entire surface in contact with the information recording layer or in accordance with pattern of the information recording layer.

In recording the information to the information recording medium of the present invention, liquid crystal phase at information recording site is oriented by electric field, which is provided between information charge to be given on the surface of the information recording layer and the electrode layer in the information recording medium. After the information has been recorded, when the information is reproduced by transmitted light as shown in FIG. 1 (b), the light beam A transmits because resin and liquid crystal have the same refractive index at the information recording site, while the light beam B scatters at the site where the information is not recorded, thus giving contrast from the information recording site.

The support member 15 mechanically supports the information recording medium, and it is not required when the information recording layer has supporting property. There is no restriction on material quality and thickness of the support member as far as it has a certain strength enough to support the information recording layer. For example, plastic film with flexibility or rigid substance such as glass, plastic sheet, etc. may be used. More concretely, in case the information recording medium is in form of flexible film, tape disk, or card, plastic film with flexibility is used. In case it must have some strength, sheet, inorganic materials with rigidity such as glass are used.

In case the recorded information is reproduced by transmitted light, a layer with reflection preventive effect may be laminated on the other side of the support member, and the support member may be adjusted to such thickness to provide reflection preventive effect, or reflection preventive property may be given by combination of the above two procedures.

In the conventional type liquid crystal display element, liquid crystal phase is dispersed and fixed in TN type or STN type liquid crystal cell where liquid crystal is sandwiched between electrodes or in macromolecular resin. In such element, if voltage between the two electrodes is turned off, it returns to initial state and it has no memory property.

However, in the information recording medium of the present invention, electrostatic information on the information recording layer is recorded and stored in visible state by arranging orientation of liquid crystal. By recording the information in form of electrostatic charge on the surface of the information recording layer, the information can be recorded and stored with gradation. Once recorded, the visible information is not erased unless it is heated even when the electrostatic charge is removed, and it has memory property.

Detailed reason is not known yet. In general, when the information recording layer where liquid crystal phase is dispersed in resin is sandwiched between two electrodes and DC voltage is applied, no memory property is exhibited, and it is operated as soon as voltage is applied, but transmittance returns to initial state within short time due to dielectric alleviation. Response also occurs at the moment when voltage is turned off, and it returns again to the initial state. However, if the electrode layer is arranged only on one side of the information recording layer and electrostatic information is given on the surface of the information recording layer, electrostatic information is stored in the resin of the surface of the information recording layer. It appears that orientation of the liquid crystal phase is permanently maintained by electric field, which is formed between the electrostatic information and the electrode of the information recording medium.

As the method to record information on the information recording medium of the present invention, corona charging may be used to electrostatically record information on the surface of the information recording layer. Or, the information recording medium of the present invention may be placed face-to-face to the electrode via an air gap, and by applying voltage between the two electrodes in pattern shape, air discharge may be performed or electric field may be formed by Paschen's law, and electrostatic information is recorded on the information recording layer.

Also, the information recording medium of the present invention may be placed face-to-face to a photosensitive member having a photoconductive layer via an air gap, and pattern exposure is performed while applying voltage between the two electrodes, and electrostatic information with gradation can be recorded on the information recording layer according to intensity of the information exposure.

Also, the present inventors have found that the memory property of the information recording layer of the present invention can be improved further if the information recording layer is heated prior to the information recording to a temperature value higher than room temperature and lower than the temperature, at which liquid crystal substance transits to isotropic phase. When the information recording layer is heated to higher than the temperature, at which liquid crystal substance transits to isotropic phase, the information recording layer is turned to transparent, and the liquid crystal substance does not exhibit liquid crystal property, and this is not desirable.

The detailed reason is not known. It appears that memory property may be increased by interaction of boundary surface between liquid crystal phase and resin in the information recording layer, and it is preferable that, after the information recording layer is heated up to the temperature, at which interaction in the boundary surface disappears, i.e. critical temperature, at which interaction in boundary surface undergoes extensive change, information is recorded at temperature somewhat lower than the above temperature, i.e. with increased interaction in boundary surface. The degree of heating can be set according to the types as well as component ratio of liquid crystal and resin. The interaction in boundary surface may be caused by structural change or extreme change of interaction in boundary surface, and the interaction persists even when cooled down or left intact.

When the information recording medium of the present invention was arranged face-to-face via an air gap to the electrode where conductive layer is formed in pattern shape, and voltage was applied on the information recording layer in pattern shape and electrostatic information was given to the information recording layer, it was confirmed that resolution occurred at a portion where 6 µm lines of the conductive layer and 6 µm space lines were arranged with each other.

Also, the resolution is closely related to thickness of the information recording medium. Because the accuracy of the thickness is precisely controlled during coating of the information recording layer in the information recording medium of the present invention, no spacer for gap control is required as in the case of laminating system or sealing system where it is sandwiched between the electrodes. Thus, information can be recorded with high resolution, and no defect occurs.

Visible information once recorded can be erased by heating to more than the critical temperature, at which interaction in boundary surface between macromolecular resin and dispersed and fixed liquid crystal undergoes extensive change, and the information recording medium can be re-used. The visible information can also be erased by heating to more than the temperature, at which liquid crystal phase transits to isotropic phase. In this case, it is turned to transparent for once, but it is turned to opaque and returns to initial non-transparent state.

In the information recording medium of the present invention, it is possible to suppress attenuation of information electric charge during recording and to maintain orientation of liquid crystal by providing an electric charge retaining layer 14 on the information recording layer 11. In this case, it is possible to electrically reproduce electrostatic information stored in the electric charge retaining layer.

Such electric charge retaining layer consists of highly insulating resin to suppress migration of electrostatic charge, and it must have insulating property with specific resistance of $10^{14}\Omega$.cm or more and also must be transparent. As such resin, fluoro-resin such as polytetrafluoroethylene, fluorinated ethylenepropylene, tetrafluoroethylene-perfluoroalkylvinyl ether copolymer, or polyimide resin, polyetheretherketone resin, polyparaxylylene, etc. may be used. The resin can be coated on the information recording layer by deposition, sputtering method, etc. or can be dissolved in solvent, and resin layer can be formed by coating or dipping. The layer may be formed by attaching a film of the above polymer by bonding agent. The thickness of the film is preferably 1 to 40 µm.

In the information recording medium shown in FIG. 1 (a) and (c), a charge blocking layer 16 may be provided between an electrode layer 13 and an information recording layer 11. The charge blocking layer is to block intrusion of electric charge from the electrode layer, and this gives an effect to retain electric field by blocking intrusion of opposite electric charge on electrode side. For the charge blocking layer, a material similar to that of the electric charge retaining layer may be used, and it may be laminated in such thickness as not to cause tunneling effect of electric charge, and at least 1000 Å or more.

The electric charge retaining layer and/or the charge blocking layer may contain photoconductive particles or conductive particles.

Next, description will be given on the information recording and reproducing method on the information recording medium of the present invention.

FIG. 2 represents drawings for explaining the information recording method, in which reference numeral 1 denotes a photosensitive member, 5 is a photoconductive layer support member, 7 is a photosensitive member electrode, 9 is a photoconductive layer, and 1 is a power supply.

On the photoconductive layer support member 5 consisting of glass of 1 mm thick, a transparent electrode 7 made of indium tin oxide (ITO) of 1000 Å thick is formed. A photoconductive layer 9 of about 10 μm is formed on it to prepare a photosensitive member 1.

As shown in FIG. 2 (a), an information recording medium 3 is arranged face-to-face to the photosensitive member 1 via a gap of about 10 μm.

Next, as shown in FIG. 2 (b), voltage is applied between electrodes 7 and 13 from the power supply 17. If in dark place, the photoconductive layer 9 is a body with high resistance.

If light 18 enters from the direction of the photosensitive member 1 under this condition, the portion of the photoconductive layer 9 irradiated by light is turned to electrically conductive and to a body with low resistance. Thus, information electric charge is stored in the information recording layer, and liquid crystal is oriented at charge stored site on the information recording layer. In case there is uniform overburdened electric charge in advance, electric charge is further stored on the portion where light is irradiated. Thus, by the contrast with nonexposed portion, information can be recorded.

In the formation of the information electric charge as describe above, some liquid crystal may be operated at low voltage. Accordingly, voltage distribution on the information recording layer may be set in the operating voltage region by adequately setting voltage distribution between the photosensitive member, air gap and information recording medium. In the recording to the information recording medium, current may be passed to the electrode layer to heat the information recording medium and to increase memory property.

By this information recording method, it is possible to attain planar analog recording, and orientation at particle level of liquid crystal can be obtained. Thus, high resolution similar to that of silver salt photographic method can be attained, and the exposed pattern can be visualized and maintained by orientation of liquid crystal phase. To input the information, a method by high resolution electrostatic camera or a method to record by laser may be used.

Information light may enter from direction of the photosensitive member or may enter from direction of the information recording medium. Instead of photographic film used in an ordinary camera, high resolution electrostatic camera forms a recording member from the photosensitive member 1 and the information recording medium 3. Thus, it is possible to use a mechanical shutter or an electric shutter.

Light information can be separated into light components of R, G and B through a prism or a color filter, and it can be taken out as parallel beams, and one frame may be formed by 3 sets of information recording media separated into R, G and B, or images in R, G and B may be aligned on a plane, and one frame may be formed in one set for color photography.

As a recording method by laser, argon laser (514 and 488 nm), helium-neon laser (633 nm) or semiconductor laser (780 nm and 810 nm) may be used as light source. The photosensitive member and the information recording medium are attached closely to each other or placed face-to-face with a certain gap, and voltage is applied. Under such condition, laser exposure corresponding to image signal, character signal, code signal or line drawing signal is performed by scanning. Analog recording such as recording of an image is performed by modulating light intensity of laser. Digital recording such as recording of character, code or line drawing is performed by ON-OFF control of laser beam. An image formed by dots is recorded by dot generation ON-OFF control on laser beam. Spectral characteristics of photoconductive layer in the photosensitive member do not have to be pan-chromatic, and it will suffice if it is sensitive to wavelength of laser source.

In the information recording to the information recording medium of the present invention, in addition to the information recording using the photosensitive member, the information electric charge may be added directly on the surface of the information recording layer through writing by corona charging, pin electrode, ion flow head, electron beam or ion implantation.

The entire surface of the information recording medium of the present invention may be charged by corona charging to orient the liquid crystal and to turn the entire medium to transparent. Then, orientation of liquid crystal phase in the information recording layer may be turned to random state according to input information by thermal printer, and information can be recorded by turning it to nontransparent by scattering. Further, the whole nontransparent information recording medium can be divided into several blocks, and the information recording layer in a certain block is turned to an area capable to record information by action of electric field corresponding to the information, and the other blocks are turned to transparent state as above. Then, information may be recorded by heating means such as thermal head.

The information recorded by orientation of liquid crystal is a visual information, which can be read visually or by magnifying by a reflection type projector. Or, using laser scanning or CCD, the information can be read with high accuracy by reflection light or transmitted light.

In the following, several examples are described:

[Example 1]

Into chloroform, 0.3 g of cyanobiphenyl type liquid crystal (manufactured by Merck; B44, Δn=0.262; N-I transition 100° C.), and 0.2 g of acrylic resin PMMA (Mitsubishi Rayon Co., Ltd.; BR-83; Tg=105° C.; weight average molecular weight 40,000; acid number 2) were dissolved, and 15 weight % solution was prepared. This solution was coated by blade coater on an electrode of glass substrate of 1 mm thick where an indium tin oxide (ITO) electrode had been laminated in thickness of 1000 Å. After drying this in an oven maintained at 80° C. for one hour, the information recording medium of the present invention was prepared. The thickness of the information recording layer was 6 μm.

[Example 2]

Into chloroform, 0.3 g of cyanobiphenyl type liquid crystal (manufactured by Merck; E44; Δn=0.262; N-I transition 100° C.) and 0.2 g of acrylic resin PMMA (manufactured by Mitsubishi Rayon Co., Ltd.; BR-87; Tg=105° C.; weight average molecular weight 25,000; acid number 10.5) were dissolved to prepare 15 weight % solution. This solution was coated by blade coater on a glass substrate of 1 mm thick, on which an indium tin oxide (ITO) electrode had been laminated in thickness of 1000 Å by sputtering method. This was dried in an oven maintained at 80° C. for one hour, and the information recording medium of the present invention was prepared. The thickness of the information recording layer was 6 μm.

[Example 3]

Into chloroform, 0.3 g of cyanobiphenyl type liquid crystal (manufactured by Merck; E44; Δn=0.262; N-I transition 100° C.) and 0.2 g of acrylic resin PMMA (manufactured by Mitsubishi Rayon Co., Ltd.; BR-80; Tg=105° C.; weight average molecular weight 95,000; acid number 0) were dissolved to prepare 15 weight % solution. This solution was coated by blade coater on a glass substrate of 1 mm thick, on which an indium tin oxide (ITO) electrode had been laminated in thickness of 1000 Å by sputtering method. This was dried in an oven maintained at 80° C. for one hour, and the information recording medium of the present invention was prepared. The thickness of the information recording layer was 6 μm.

[Example 4]

Into chloroform, 0.3 g of cyanobiphenyl type liquid crystal (manufactured by Merck; E44; Δn=0.262; N-I transition 100° C.) and 0.67 g of acrylic resin PMMA (manufactured by Mitsubishi Rayon Co., Ltd.; LR-343 (toluene solution containing 30% solids); Tg=105° C.; weight average molecular weight 100,000; acid number 2) were dissolved to prepare 15 weight % solution. This solution was coated by blade coater on a glass substrate of 1 mm thick, on which an indium tin oxide (ITO) electrode had been laminated in thickness of 1000 Å by sputtering method. This was dried in an oven maintained at 80° C. for one hour, and the information recording medium of the present invention was prepared. The thickness of the information recording layer was 6 μm.

[Example 5] (comparative example)

Into chloroform, 0.3 g of cyanobiphenyl type liquid crystal (manufactured by Merck; E44; Δn=0.262; N-I transition 100° C.) and 0.2 g of acrylic resin PMMA (manufactured by Mitsubishi Rayon Co., Ltd.; BR-100; Tg=105° C.; weight average molecular weight 120,000; acid number 0) were dissolved to prepare 15 weight % solution. This solution was coated by blade coater on a glass substrate of 1 mm thick, on which an indium tin oxide (ITO) electrode had been laminated in thickness of 1000 Å by sputtering method. This was dried in an oven maintained at 80° C. for one hour, and the information recording medium of the present invention was prepared. The thickness of the information recording layer was 6 μm.

[Example 6]

Into chloroform, 0.3 g of cyanobiphenyl type liquid crystal (manufactured by Merck; E44; Δn=0.262; N-I transition 100° C.) and 0.2 g of acrylic resin PMMA (manufactured by Mitsubishi Rayon Co., Ltd.; BR-52; Tg=105° C; weight average molecular weight 85,000; acid number 0) were dissolved to prepare 15 weight % solution. This solution was coated by blade coater on a glass substrate of 1 mm thick, on which an indium tin oxide (ITO) electrode had been laminated in thickness of 1000 Å by sputtering method. This was dried in an oven maintained at 80° C. for one hour, and the information recording medium of the present invention was prepared. The thickness of the information recording layer was 6 μm.

[Example 7]

The surface of the information recording layer of the information recording medium prepared in each of the above Examples 1 to 6 was subjected to positive or negative charging in pattern shape by corona charging. Then, it was left to stand for 5 days under room temperature, and light transmittance (%) at 900 nm of the charged portion and noncharged portion was determined using a visible-UV spectroscope (Shimadzu; UV-240). The results are summarized in Table 1.

TABLE 1

| Example No. | Positive charging | | Negative charging | |
|---|---|---|---|---|
| | Non charged portion | Charged portion | Non charged portion | Charged portion |
| 1 | 32% | 61% | 30% | 54% |
| 2 | 20% | 65% | 18% | 41% |
| 3 | 25% | 60% | 30% | 68% |
| 4 | 22% | 64% | 19% | 45% |
| 5 | 30% | 35% | 25% | 30% |
| 6 | 24% | 63% | 25% | 70% |

As it is evident from this table, the information recording medium of the present invention shows satisfactory performance to retain transmittance in both positive and negative charging.

Next, the surface of the information recording layer of the information recording medium prepared in each of the above Examples 1 to 6 was subjected to positive or negative charging in pattern shape by corona charging. Then, using a polarizing microscope with heating stage (Olympus Optical Co., Ltd.), it was heated at temperature increase rate of 5 K/min., and the temperature (°C.), at which the recorded information was erased, was determined by measuring the temperature, at which liquid crystal returned from transmitting state to scattering state. The results are shown in Table 2.

TABLE 2

| Examples | Positive charging | Negative charging |
|---|---|---|
| 1 | 55° C. | 55° C. |
| 2 | 61° C. | 62° C. |
| 3 | 40° C. | 35° C. |
| 4 | 56° C. | 50° C. |
| 5 | 35° C. | 33° C. |
| 6 | 43° C. | 37° C. |

[Example 8]

An information recording medium was prepared by the same procedure as in Example 2, except that information recording layer was prepared at the resin-liquid crystal ratio (weight ratio) of 2/1, 3/2, 1/1, 2/3 and 1/2 respectively.

The surface of the information recording layer of each medium was subjected to positive or negative charging in pattern shape by corona charging. Using a polarizing microscope with heating stage (Olympus Optical Co., Ltd.), it was heated at temperature increase ratio of 5 K/min., and the temperature, at which the recorded information was erased, was determined by measuring the temperature, at which liquid crystal returned from transmitting state to scattering state. The results are given in Table 3.

TABLE 3

| Component ratio | Positive charging | Negative charging |
|---|---|---|
| 2/1 | 79° C. | 76° C. |
| 3/2 | 68° C. | 64° C. |
| 1/1 | 64° C. | 57° C. |
| 2/3 | 61° C. | 62° C. |
| 1/2 | −38° C. | — |

As shown above, it was confirmed that the information recording medium of the present invention had liquid crystal phase in the recording layer oriented by surface electric charge and the permanent recording was attained, and that the recording could be erased by heating.

[Example 9]

The recording medium of Example 1 and the recording medium heated at about 80° C. in an oven were subjected to negative charging by corona charging.

On each of these recording media, light transmittance (%) at 900 nm of the charged portion was determined by visible-UV spectroscope (Shimadzu; UV-240) immediately after charging and after leaving it at room temperature for 5 days. Thus, the effect of heating the information recording medium before recording was evaluated. The results are given in Table 4.

TABLE 4

|  | Immediately after corona charging | 5 days after |
| --- | --- | --- |
| No heating before corona charging | 73% | 24% |
| Heated at 80° C. before corona charging | 75% | 54% |

As it is evident from the above table, memory property increases when the information recording medium was heated before recording. It is preferable that heating temperature is high, but if it is heated to higher than glass transition temperature of the resin, the resin and the liquid crystal become compatible, and sufficient contrast cannot be obtained.

Next, when the recording medium with recorded information was heated at 70° C., transparency was lost on the portion with recorded information, and it was turned to opaque and information was erased.

[Example 10]

(Preparation of photosensitive member)

On a thoroughly rinsed glass substrate of 1.1 mm thick, ITO film of 1000 Å thick was formed by sputtering method, and an electrode layer was obtained.

As electric charge generator agents, 3 weight parts of fluorenone azo pigment (Japan Photosensitive Pigment Co.) having the following structure:

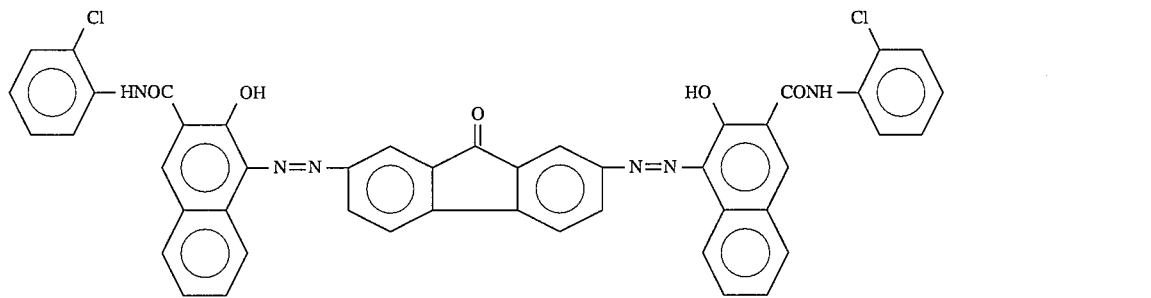

1 weight part of polyester resin (Toyobo Co., Vylon 200), 98 weight parts of 1,4-dioxane, and 98 weight parts of anone were mixed, and a coating solution was prepared by dispersing for 6 hours using a paint shaker. This was coated on the above electrode at 1400 rpm for 0.4 sec. by spinner and was dried at 100° C. for one hour, and an electric charge generating layer of 3000 Å thick was laminated.

Then, 25 weight parts of paradimethylstilbene given by the following structure:

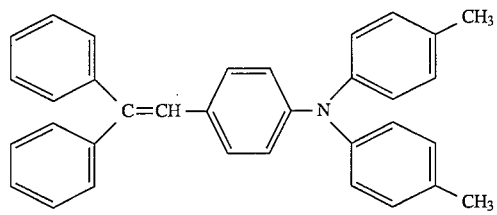

5 weight parts of polystyrene resin (Denka; HRM-3), 102 weight parts of 1,1,2-trichloroethane, and 68 weight parts of dichloromethane were mixed as electric charge transporting agent to prepare a coating solution. This was coated on the above electric charge generating layer at 300 rpm and 0.3 msec by spinner and was then dried at 80° C. for 2 hours to laminate an electric charge transport layer. Thus, a photoconductive layer of 20 μm thick, comprising the electric charge generating layer and the electric charge transport layer, was formed, and a photosensitive member was prepared.

This photosensitive member and the information recording member prepared in Example 1 were placed face-to-face with a gap of 9 μm as shown in FIG. 2. Between two electrodes of the photosensitive member and the information recording medium, voltage of 750 V was applied with the photosensitive member as positive. A gray scale was projected for exposure for 0.1 sec., and light transmittance was determined on the exposed portion and the non-exposed portion as in Example 7, and it was found that the recording corresponding to the exposure information can be accomplished.

Instead of the gray scale, a negative image of silver salt photography was projected for exposure, and the information recording medium thus obtained was read using a film scanner (Nikon; LS-3500). When printed out, a positive image with gradation corresponding to negative image of silver salt photography was reproduced.

[Example 11]

The recording medium prepared by the same procedure as in Example 1 was placed face-to-face to an electrode of pattern shape with 6 μm lines aligned with 6 μm spacing on glass, and DC voltage of 750 V was applied for 0.1 sec. on the ends of the electrode of the recording medium and the pattern electrode. As a result, it was confirmed that 6 μm lines and spacings were resolved on the recording medium, and the resolution was maintained even after electric charge was removed.

[Example 12]

On an information recording layer formed by the same procedure as in Example 1, 5% fluorine type solution of fluoro-resin (Asahi Glass; Saitop) was coated by spin coating (1500 rpm; 30 sec.). After leaving this at room temperature for one day and drying in a vacuum oven at 80° C., an electric charge retaining layer of about 0.5 μm thick was prepared, and the information recording medium of the present invention was prepared.

When electrostatic information was recorded by the same procedure as in Example 10 on this information recording medium, it was confirmed that the recording can be accomplished similarly to Example 10.

After leaving this information recording medium at room temperature for 20 days, visible image was maintained and it could be read by surface potentiometer as information charge.

[Example 13]

On an information recording layer formed by the same procedure as in Example 1, 20% hexane solution of rosin ester resin (Rika Hercules Co., Ltd.; Stebelite Ester 10) was coated by spin coating (2000 rpm; 30 sec.). Then, it was dried in an oven kept at 60° C. for two hours, and an electric charge retaining layer of about 0.7 μm thick was prepared. Then, a-Se fine particles were deposited on the surface of the electric charge retaining layer using a vacuum depositer (Shinku Kiko Co., Ltd.; VPC-410) under the following conditions:

First, the above medium was fixed on a substrate holder for heating in a vacuum chamber so that glass surface is brought into contact with the holder, and the substrate holder was heated at 70° C. under vacuum degree of 6 Torr. By resistance heating method, a-Se was provided in form of fine particles near the surface of the electric charge retaining layer, and the information recording medium of the present invention was prepared.

Next, electrostatic information was recorded on this information recording medium by the same procedure as in Example 10, and the recording could be accomplished as in Example 10.

After this information recording medium was left at room temperature for 20 days, it was found that visible image was maintained, and that surface potential could be reproduced by surface potentiometer.

[Example 14]

On a glass substrate electrode of 1 mm thick, on which an indium tin oxide (ITO) electrode had been laminated in thickness of 1000 Å by sputtering method, 5% fluorine type solution of fluoro-resin (Asahi Glass; Saitop) was coated by spin coating (1500 rpm; 30 sec.). After leaving this at room temperature for one day, it was dried in an oven kept at 150° C. for 3 hours, and a layer of about 0.5 μm thick was prepared. The surface was processed by plasma processing, and an information recording layer of 6 μm thick was formed by the same procedure as in Example 1 on a charge blocking layer. Thus, the information recording medium of the present invention was prepared.

When electrostatic information was recorded by the same procedure as in Example 10 on this information recording medium, it was confirmed that the recording can be accomplished in similar manner.

On the information recording layer of the information recording medium, 5% fluorine type solution of fluoro-resin (Asahi Glass; Saitop) was coated by spin coating (1500 rpm; 30 sec.). After leaving this at room temperature for one day, it was dried in a vacuum oven kept at 80° C., and an electric charge retaining layer of about 0.5 μm thick was formed. Thus, the information recording medium of the present invention was prepared. Then, electrostatic information was recorded by the same procedure as in Example 10, and it was confirmed that the recording can be accomplished in similar manner.

When this information recording medium was left at room temperature for 20 days, it was found that visible image was maintained, and surface potential could be reproduced by surface potentiometer.

INDUSTRIAL APPLICABILITY

The present invention provides an information recording medium for recording electrostatic information in visible state, and information can be kept permanently in visible state and analog information can be recorded and memorized. The recorded information can be reproduced by contrast of scattered light and transmitted light without using a polarizing plate, and optical system for reading the information can be simplified. Further, the information recording layer can be produced in uniform thin film by advanced coating technique, and uniform gap can be maintained between the information charge on the surface of the information recording layer and the electrode layer. Accordingly, it is possible to produce the information recording medium with large surface area and also to record and reproduce images with high resolution.

What we claim is:

1. An information recording medium, comprising an information recording layer of acrylic resin or methacrylic resin being laminated on an electrode layer, a liquid crystal phase that is a nematic phase or a cholesteric phase at operating environmental temperature being dispersed and fixed on said information recording layer, whereby weight average molecular weight of said acrylic resin or methacrylic resin is 25,000 to 100,000.

2. An information recording medium, comprising an information recording layer of acrylic resin or methacrylic resin being laminated on an electrode layer, a liquid crystal phase that is a nematic phase or a cholesteric phase at operating environmental temperature being dispersed and fixed on said information recording layer, whereby weight average molecular weight of said acrylic resin or methacrylic resin is 25,000 to 100,000 and has an acid number of 2 or more.

3. An information recording medium, comprising an information recording layer of acrylic resin or methacrylic resin and an electric charge retaining layer that are sequentially laminated on an electrode layer, a liquid crystal phase that is a nematic phase or a cholesteric phase at operating environmental temperature being dispersed and fixed on said information recording layer, whereby weigh average molecular weight of said acrylic resin or methacrylic resin is 25,000 to 100,000.

4. An information recording medium according to one of claims 1 to 3, wherein said information recording layer is heated, before recording of information, at a temperature higher than room temperature and lower than the temperature at which liquid crystal transits to isotropic phase.

5. An information recording medium according to one of claims 1 to 3, wherein said resin has glass transition temperature higher than operating environmental temperature.

6. An information recording medium according to one of claims 1 to 3, wherein said information recording layer is laminated on the electrode layer via a charge blocking layer.

7. An electrostatic information recording and reproducing method, characterized in that an information recording medium is placed face-to-face to a photosensitive member comprising a photoconductive layer formed on an electrode layer, said information recording medium comprising an information recording layer of acrylic resin or methacrylic resin being laminated on an electrode layer, a liquid crystal phase that is a nematic phase or a cholesteric phase at operating environmental temperature being dispersed and fixed on said information recording layer, said resin having weight average molecular weight of 25,000 to 100,000, electrostatic information recording is performed by exposing to light from the direction of the photosensitive member of the information recording medium while applying a voltage between said two electrodes, and electrostatic information is recorded and stored as visible information and is reproduced at any time desired.

8. An electrostatic information recording and reproducing method, characterized in that an information recording medium is placed face-to-face to a photosensitive member comprising a photoconductive layer on an electrode layer, said information recording medium comprising an information recording layer made of acrylic resin or methacrylic resin being laminated on an electrode layer, a liquid crystal phase that is a nematic phase or a cholesteric phase at operating environmental temperature being dispersed and fixed on said information recording layer, said resin having weight average molecular weight of 25,000 to 100,000 and an acid number of 2 or more, electrostatic information recording is performed by exposing to light from the direction of the photosensitive member or the information recording medium while applying a voltage between two electrodes, and electrstatic information is recorded and stored as visible information and reproduced at any time desired.

9. An electrostatic information recording and reproducing method according to claim 8, wherein visible information is reproduced by transmitted light or reflected light.

* * * * *